United States Patent
Montazer

(10) Patent No.: US 7,400,171 B1
(45) Date of Patent: Jul. 15, 2008

(54) ELECTRONIC SWITCH HAVING EXTENDED VOLTAGE RANGE

(75) Inventor: G. Hossein Montazer, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 183 days.

(21) Appl. No.: 11/121,326

(22) Filed: May 3, 2005

(51) Int. Cl.
*H03K 19/094* (2006.01)
*H03L 5/00* (2006.01)

(52) U.S. Cl. .............................. 326/83; 326/68; 327/333
(58) Field of Classification Search ................... 326/63, 326/68, 80, 81, 62, 113; 327/333
See application file for complete search history.

(56) References Cited

U.S. PATENT DOCUMENTS

| | | | |
|---|---|---|---|
| 4,064,405 A * | 12/1977 | Cricchi et al. | 326/34 |
| 4,677,325 A * | 6/1987 | Einzinger et al. | 327/437 |
| 5,243,236 A * | 9/1993 | McDaniel | 326/68 |
| 5,559,464 A * | 9/1996 | Orii et al. | 327/333 |
| 5,723,986 A * | 3/1998 | Nakashiro et al. | 326/81 |
| 6,060,904 A * | 5/2000 | Shimoda | 326/68 |
| 6,300,796 B1 * | 10/2001 | Troutman et al. | 326/81 |
| 6,370,071 B1 * | 4/2002 | Lall et al. | 365/205 |
| 6,407,579 B1 * | 6/2002 | Goswick | 326/81 |
| 6,433,983 B1 * | 8/2002 | Fechner | 361/111 |
| 6,456,110 B1 * | 9/2002 | Elamanchili et al. | 326/68 |
| 6,563,362 B2 * | 5/2003 | Lambert | 327/333 |
| 6,566,909 B2 * | 5/2003 | Okumura | 326/68 |
| 6,646,468 B2 * | 11/2003 | Aitouarab | 326/81 |
| 6,700,407 B1 * | 3/2004 | Wert | 326/81 |
| 6,734,704 B1 * | 5/2004 | Burkland | 326/63 |
| 6,815,984 B1 * | 11/2004 | Bowers et al. | 327/112 |
| 6,865,117 B2 * | 3/2005 | Kozicki | 365/189.09 |
| 7,034,585 B1 * | 4/2006 | Kiani | 327/143 |

* cited by examiner

*Primary Examiner*—Rexford Barnie
*Assistant Examiner*—Thienvu V Tran

(57) ABSTRACT

In one embodiment, an electronic switch selectively passes an input signal from an input node to an output node based on a switch-control signal. The bulk of at least one transistor in the switch is connected to either the input node or the output node. The switch has two series-connected PMOS transistors connected in parallel with an NMOS transistor. The bulk and source of the first PMOS transistor are connected to the input node, while the bulk and source of the second PMOS transistor are connected to the output node. First and second level shifters ensure that the gates of the first and second PMOS transistors track the voltages at the input and output nodes, respectively. This configuration improves the ability of the switch to receive input voltages outside of the switch's power supply range without adversely affecting operations of the switch.

13 Claims, 1 Drawing Sheet

ELECTRONIC SWITCH HAVING EXTENDED VOLTAGE RANGE

TECHNICAL FIELD

The present invention relates to electronics, and, in particular, to the electronic switches, such as complementary metal-oxide semiconductor (CMOS) switches.

BACKGROUND

A conventional CMOS switch comprises one or more CMOS transistors, each with its bulk (e.g., substrate or well) connected to one of the power supply rails (i.e., Vdd or Vss). For example, a single N-type CMOS (NMOS) transistor, with its drain connected to the input node Vin, its source connected to the output node Vout, its gate connected to receive a switch-control signal, and its bulk connected to Vss, can function as a CMOS switch that selectively presents an input voltage appearing at node Vin as an output voltage at node Vout, where the value of the switch-control signal applied to the transistor gate determines whether the switch passes or holds off the input signal.

Another example of a conventional CMOS switch is formed from an NMOS transistor connected in parallel to a P-type CMOS (i.e., PMOS) transistor, where the NMOS transistor is configured as before, and the PMOS transistor has its source connected to node Vin, its drain connected to node Vout, its gate connected to receive an inverted version of the switch-control signal, and its bulk connected to Vdd.

The ranges of voltages that can be applied to such conventional CMOS switches are often limited due to finite N-channel and/or P-channel thresholds. In some situations, the allowable input range spans only a portion of the available supply voltage range (e.g., Vdd-Vss). Moreover, any voltage beyond the supply voltage range is usually not allowed, since it may interfere with the proper operation of the switch in its open (i.e., off) mode.

To accommodate an input voltage range beyond the supply voltage range, some prior-art implementations rely on a boosted supply. This more-positive and/or more-negative supply is often locally generated and used instead of the PC board power supply, in effect operating the switch from a new power supply that now includes the desired expanded range.

Another prior-art implementation relies on attenuation of all input voltages to ensure that the input voltage levels remain within the allowable range.

SUMMARY

In one embodiment, the present invention includes a switch circuit for selectively presenting an input signal appearing at an input node of the switch circuit as an output signal at an output node of the switch circuit. The switch circuit comprises a switch block and switch-control circuitry. The switch-control circuitry is adapted to selectively open and close the switch block based on a switch-control signal. The switch block is connected between the input node and the output node and comprises one or more interconnected transistors, wherein a bulk of at least one transistor in the switch block is connected to one of the input node and the output node.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

Figure 1:
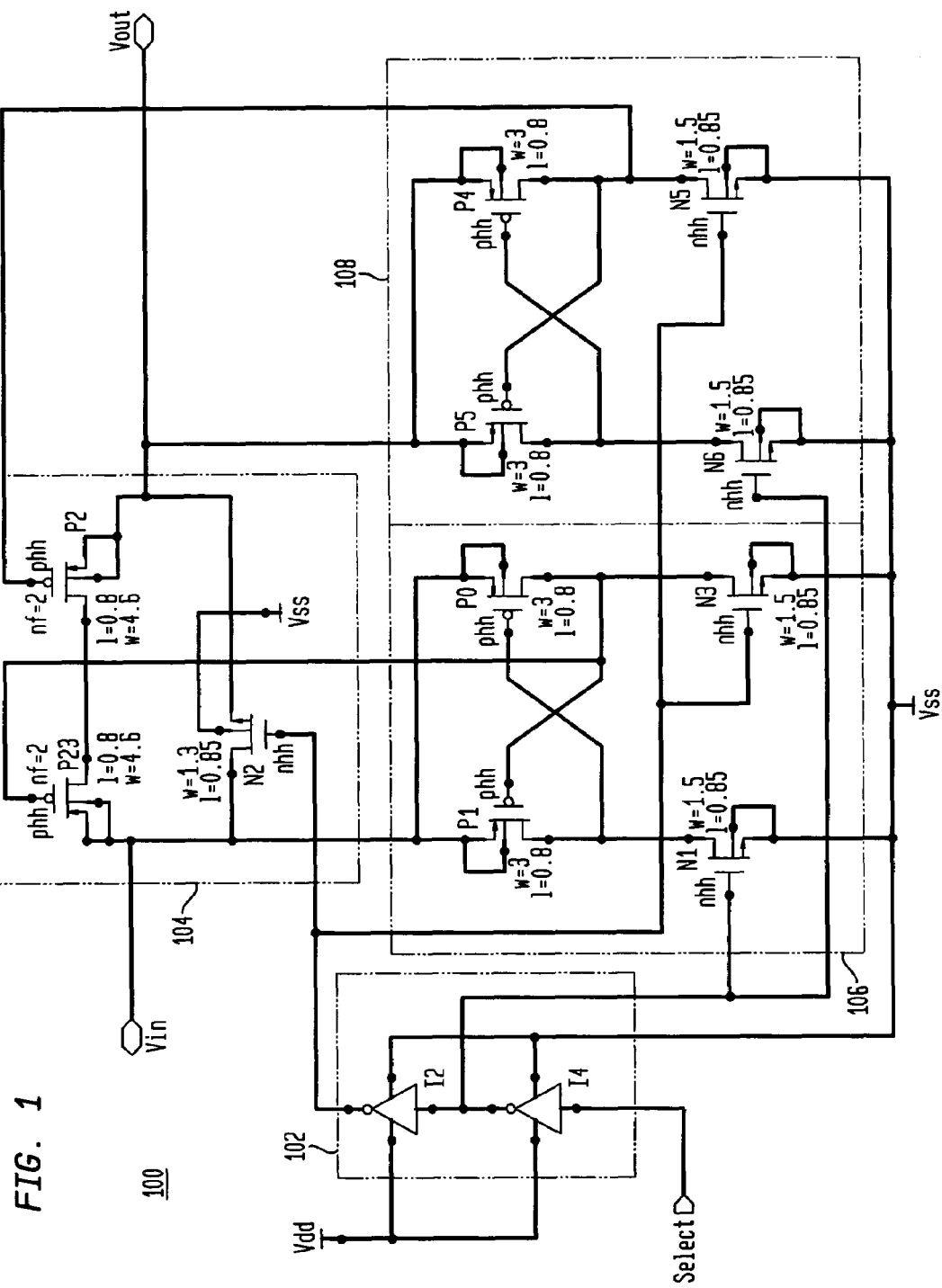
FIG. 1 shows a schematic circuit diagram of a switch circuit, according to one embodiment of the present invention.

FIG. 1 shows a schematic circuit diagram of a switch circuit 100, according to one embodiment of the present invention. Based on a switch-control signal applied at node Select, switch circuit 100 selectively presents an input voltage applied at node Vin as an output voltage at node Vout.

Switch circuit 100 comprises control-signal buffer 102, switch block 104, and first and second level shifters 106 and 108. Control-signal buffer 102 buffers the switch-control signal applied at the Select node and provides buffered (inverted and non-inverted) versions of the switch-control signal to switch block 104 and level shifters 106 and 108. Level shifters 106 and 108 shift the levels of the buffered switch-control signals from buffer 102 (from the range (Vss,Vdd) to the ranges (Vss,Vin/Vout)) and apply level-shifted versions of the buffered switch-control signals to switch block 104. The buffered switch-control signal from buffer 102 and the level-shifted switch-control signals from level shifters 106 and 108 determine whether switch block 104 in an open (i.e., off) mode or a closed (i.e., on) mode.

If switch block 104 is in its open mode, then switch block 104 holds off the input voltage applied at node Vin (i.e., the input voltage is not presented as an output voltage at node Vout). In its open mode, switch block 104 also holds off the high voltages applied at node Vout from reaching node Vin. If switch block 104 is in its closed mode, then switch block 104 passes the input voltage applied at node Vin to the node Vout (i.e., the input voltage is presented as an output voltage at node Vout). Together, control-signal buffer 102 and level shifters 106 and 108 form switch-control circuitry for switch circuit 100.

Physical Description

Switch block 104 comprises two sets of one or more transistors connected in parallel, where the first set has PMOS transistor P23 connected in series with PMOS transistor P2 (i.e., at their drains) and the second set has just NMOS transistor N2. As shown in FIG. 1, the source and bulk of P23 and the drain of N2 are all connected to node Vin. Similarly, the source and bulk of P2 and the source of N2 are all connected to node Vout. The bulk of N2 is connected to Vss (e.g., ground).

Control-signal buffer 102 comprises inverters I4 and I2 connected in series, such that the output of I4 is connected to the input of I2. The output of I2 is connected to the gate of N2.

First level shifter 106 comprises a pair of cross-connected (i.e., gate to drain) PMOS transistors P0 and P1 connected in series with a pair of NMOS transistors N3 and N1, respectively (at their drains). Similarly, second level shifter 108 comprises a pair of cross-connected PMOS transistors P4 and P5 connected in series with a pair of NMOS transistors N5 and N6, respectively (at their drains). The output of inverter I4 is connected to the gates of N1 and N6, while the output of inverter I2 is connected to the gates of N3 and N5. The sources and bulks of P0 and P1 are both connected to node Vin, and the sources and bulks of P4 and P5 are both connected to node Vout. The sources and bulks of N1, N3, N5, and N6 are all connected to Vss.

Functional Description

Low Switch-Control Signal

Functionally, if the switch-control signal applied at the Select node is low (e.g., Vss), then the output of inverter I4 is high (i.e., Vdd) and the output of inverter I2 is low (i.e., Vss).

If the output of I2 is low, then N2 is off and N2 prevents the input voltage applied to node Vin from reaching Vout and also prevents a voltage applied at node Vout from reaching Vin.

If (i) the output of I4 is high and (ii) the output of I2 is low, then (a) N1 and N6 are both on and (b) N3 and N5 are both off.

In first level shifter 106, if N1 is on, then the gate of P0 is driven towards Vss, which turns P0 on. If P0 is on and N3 is off, then the gate of P23 tracks the input voltage applied to node Vin. If the input voltage at Vin is low, then P23 is on. If the input voltage at Vin is high, then P23 is off.

Similarly, in second level shifter 108, if N6 is on, then the gate of P4 is driven towards Vss, which turns P4 on. If P4 is on and N5 is off, then the gate of P2 tracks the voltage applied to node Vout. If the voltage at Vout is low, then P2 is on. If the voltage at Vout is high, then P2 is off.

Thus, if the voltages at Vin and Vout are both low, then P23 and P2 are both on, but, since, Vin and Vout are both low, it is functionally the same as if Vin and Vout were held off from each other. If (i) the input voltage at Vin is low and (ii) the voltage at Vout is high, then (a) P23 is on and (b) P2 is off, and the voltages at Vin and Vout are held off from each other. Similarly, if (i) the input voltage at Vin is high and (ii) the output voltage at Vout is low, then (a) P23 is off and (b) P2 is on, and the voltages at Vin and Vout are held off from each other. Lastly, if the voltages at nodes Vin and Vout are both high, then P23 and P2 are both off and the voltages at Vin and Vout are held off from each other.

As such, if the switch-control signal is low, then switch block 104 is functionally open (i.e., off), no matter whether the voltages applied at Vin and Vout are high or low.

High Switch-Control Signal

If, on the other hand, the switch-control signal applied at the Select node is high (e.g., Vdd), then the output of inverter I4 is low (i.e., Vss) and the output of inverter I2 is high (i.e., Vdd).

If the output of I2 is high, then N2 is on and N2 enables the input voltage applied to node Vin to reach Vout.

If (i) the output of I4 is low and (ii) the output of I2 is high, then (a) N1 and N6 are both off and (b) N3 and N5 are both on.

In first level shifter 106, if N3 is on, then the gate of P1 is driven towards Vss, which turns P1 on. If P1 is on and N1 is off, then the gate of P0 tracks the input voltage applied to node Vin. If the input voltage at Vin is low, then P0 is on. If P0 and N3 are both on, then the gate of P23 also tracks the low input voltage applied to node Vin and P23 is on. If the input voltage at Vin is high, then P0 is off. If P0 is off and N3 is on, then the gate of P23 is driven towards Vss, which turns P23 on.

Similarly, in second level shifter 108, if N5 is on, then the gate of P5 is driven towards Vss, which turns P5 on. If P5 is on and N6 is off, then the gate of P4 tracks the voltage applied to node Vout. If the voltage at Vout is low, then P4 is on. If P4 and N5 are both on, then the gate of P2 also tracks the low voltage applied to node Vout and P2 is on. If the voltage at Vout is high, then P4 is off. If P4 is off and N5 is on, then the gate of P2 is driven towards Vss, which turns P2 on.

Thus, if the switch-control signal is high, then the P23 and P2 are both on, no matter whether the voltages applied at Vin and Vout are high or low. As such, if the switch-control signal is high, then switch block 104 is functionally closed (i.e., on).

Application of High Input/Output Voltages

The two sets of transistors in switch block 104 form two switch paths: one path containing P23 and P2 and the other path containing N2. Each path, when selected, passes signals over a portion of the supply range (Vdd-Vss).

Moreover, since the bulk of P23 is connected to Vin, if an input voltage greater than Vdd is applied to Vin, then the bulk voltage and the source voltage of P23 will both track the input voltage at Vin. This reduces the chances of breakdown or other adverse effects at P23 due to high input voltages compared to a prior-art configuration in which the bulk of a PMOS transistor would be connected to Vdd. Moreover, first level shifter 106 ensures that the gate of P23 also tracks the input voltage at Vin, which further reduces the chances of problems at P23 due to input voltages greater than Vdd.

Similarly, since the bulk of P2 is connected to Vout, if a voltage greater than Vdd is applied to Vout, then the bulk voltage and the source voltage of P2 will both track the voltage at Vout. This reduces the chances of breakdown or other adverse effects at P2 due to high voltages at Vout compared to a prior-art configuration in which the bulk of a PMOS transistor would be connected to Vdd. Moreover, second level shifter 108 ensures that the gate of P2 also tracks the voltage at Vout, which further reduces the chances of problems at P2 due to voltages at Vout greater than Vdd.

Thus, switch circuit 100 is capable of passing or holding off in either direction (i.e., Vout to Vin as well as Vin to Vout). The input signal range includes the entire power supply range. The input signal range also includes signals within one threshold voltage below the negative supply. On the positive side, the input signal can be substantially higher than the positive supply so long as no device breakdown level is exceeded. This extended input signal range is achieved without requiring either a boosted power supply or attenuation of the input signals. Also switch drivers require no stand-by DC current from either input or output.

ALTERNATIVE EMBODIMENTS

The present invention has been described in the context of switch circuit 100 in which switch block 104 has two transistor sets connected in parallel, where the first set has two PMOS transistors (P23 and P2) and the second set has only one NMOS transistor (N2). The present invention is not necessarily limited to this embodiment. For example, in an alternative embodiment, the first set could have a single PMOS transistor and the second set could have two NMOS transistors, where the bulk of the PMOS transistor is connected to Vdd and the bulk of each NMOS transistor is appropriately connected to either the input node or the output node. Such an embodiment would have a negative voltage range. In another alternative embodiment, the first set could have two PMOS transistors and the second set could have two NMOS transistors, where the bulk of each NMOS and PMOS transistor is appropriately connected to either the input node or the output node. Such an embodiment would have a voltage range that spans beyond both positive and negative supply voltages.

The present invention can be implemented in the context of any CMOS technology, such as N-well, P-well, or multiple-well technologies. As used in the following claims, the term "channel terminal" refers generically to either the source or the drain of a CMOS transistor.

The present invention may, but does not have to, be implemented in a single integrated circuit, such as application-specific integrated circuit (ASIC) or a programmable device such as a field-programmable gate array (FPGA).

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of FIGURE numbers and/or FIGURE reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

I claim:

1. A switch circuit for selectively presenting an input signal appearing at an input node of the switch circuit as an output signal at an output node of the switch circuit, the switch circuit comprising:
   a switch block connected between the input node and the output node and comprising first and second transistors of a first type connected in series between the input node and the output node, wherein a bulk and a channel terminal of the first transistor are connected to the input node and a bulk and a channel terminal of the second transistor are connected to the output node; and
   switch-control circuitry adapted to selectively open and close the switch block based on a switch-control signal, wherein the switch-control circuitry comprises:
      a first level shifter connected to a gate of the first transistor and adapted to convert the switch-control signal for application to the gate of the first transistor such that the voltage applied to the gate of the first transistor tracks the voltage at the input node; and
      a second level shifter connected to a gate of the second transistor and adapted to convert the switch-control signal for application to the gate of the second transistor such that the voltage applied to the gate of the second transistor tracks the voltage at the output node.

2. The invention of claim 1, wherein the switch block further comprises a third transistor of a second type connected in parallel with the first and second transistors, wherein:
   the first type of transistor is either p type of transistor or n type of transistor;
   if the first type of transistor is of the p type, then the third transistor is of the n type; and
   if the first type of transistor is of the n type, then the third transistor is of the p type.

3. The invention of claim 1, wherein the switch-control circuitry comprises a level shifter adapted to ensure that a gate of the at least one transistor tracks a voltage at one of the input node and the output node.

4. The invention of claim 1, wherein the switch-control circuitry comprises a level shifter adapted to convert the switch-control signal from a power supply range for the switch circuit to a voltage range based on the voltage at one of the input node and the output node for application to the switch block.

5. The invention of claim 1, wherein the switch block comprises first and second sets of transistors connected in parallel between the input node and the output node, wherein:
   the first set comprises the first and second transistors of a first type connected in series between the input node and output node; and
   the second set comprises a third transistor of a second type connected between the input node and the output node.

6. The invention of claim 5, wherein the switch-control circuitry is connected to gates of the first, second, and third transistors and adapted to selectively turn on and off the first, second, and third transistors based on the switch-control signal.

7. The invention of claim 1, wherein the switch-control circuitry further comprises first and second inverters, wherein:
   the first inverter is connected to receive the switch-control signal and adapted to generate an inverted version of the switch-control signal;
   the second inverter is connected to receive the inverted version of the switch-control signal and adapted to generate a non-inverted version of the switch-control signal;
   each level shifter comprises a pair of cross-connected transistors of the first type connected in series with a pair of transistors of the second type;
   the gates of the two pairs of level-shifter transistors of the second type are connected to receive the inverted and non-inverted versions of the switch-control signal;
   the cross-connected transistors of the first level shifter are connected to apply the voltage at the input node to the gate of the first transistor; and
   the cross-connected transistors of the second level shifter are connected to apply the voltage at the output node to the gate of the second transistor.

8. The invention of claim 7 wherein:
   the transistors of the first type are PMOS transistors; and
   the transistors of the second type are NMOS transistors.

9. The invention of claim 5, wherein:
   if a voltage outside a supply voltage range for the switch circuit appears at the input node, the voltage difference between the bulk and the channel terminal of the first transistor remains below a breakdown voltage level for the first transistor; and
   if a voltage outside the supply voltage range for the switch circuit appears at the output node, the voltage difference between the bulk and the channel terminal of the second transistor remains below a breakdown voltage level for the second transistor.

10. The invention of claim 1, wherein the input signal is distinct from the switch-control signal.

11. The invention of claim 1, wherein only one channel terminal of the first transistor is connected to a channel terminal of the second transistor.

12. The invention of claim 1, wherein:
   if the switch block is closed and the input signal is high, then the output signal is high; and
   if the switch block is closed and the input signal is low, then the output signal is low.

13. The invention of claim 1, wherein a common node in the series connection between the first and second transistors is not directly connected to either the input node or the output node.

* * * * *